(12) United States Patent
Lin

(10) Patent No.: US 8,482,122 B2
(45) Date of Patent: Jul. 9, 2013

(54) CONDUCTIVE PAD STRUCTURE, CHIP PACKAGE STRUCTURE AND DEVICE SUBSTRATE

(75) Inventor: Yen-Chieh Lin, Taoyuan County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 0 days.

(21) Appl. No.: 13/071,515

(22) Filed: Mar. 25, 2011

(65) Prior Publication Data
US 2012/0146217 A1 Jun. 14, 2012

(30) Foreign Application Priority Data
Dec. 10, 2010 (TW) .............................. 99224056 U

(51) Int. Cl.
*H01L 23/48* (2006.01)

(52) U.S. Cl.
USPC .... 257/737; 257/738; 257/783; 257/E23.021; 257/E23.068; 257/E23.069

(58) Field of Classification Search
USPC .................. 257/737, 738, E23.021, E23.069, 257/780–784, E23.068; 438/612–617; 228/180.22
See application file for complete search history.

(56) References Cited

U.S. PATENT DOCUMENTS

| 5,545,589 | A  | * | 8/1996  | Tomura et al. | 438/119 |
|-----------|----|---|---------|---------------|---------|
| 5,731,636 | A  | * | 3/1998  | Chun          | 257/784 |
| 5,903,056 | A  | * | 5/1999  | Canning et al.| 257/773 |
| 6,232,563 | B1 | * | 5/2001  | Kim et al.    | 174/261 |
| 6,489,687 | B1 | * | 12/2002 | Hashimoto     | 257/777 |
| 6,613,662 | B2 | * | 9/2003  | Wark et al.   | 438/613 |
| 7,651,886 | B2 | * | 1/2010  | Wang          | 438/106 |
| 7,750,469 | B2 | * | 7/2010  | Cho et al.    | 257/738 |

FOREIGN PATENT DOCUMENTS
JP 2000-332055 11/2000
TW I263349 10/2006

* cited by examiner

*Primary Examiner* — Jasmine Clark
(74) *Attorney, Agent, or Firm* — Jianq Chyun IP Office

(57) ABSTRACT

A conductive pad structure, configured in a peripheral circuit area of a device substrate, is provided. The conductive pad structure includes a conductive pad and a plurality of conductive spacers. The conductive spacers are configured on the conductive pad and arranged as a non-closed pattern on the conductive pad. Besides, a chip package structure and a device substrate that both have the above-mentioned conductive pad structure are also provided.

16 Claims, 4 Drawing Sheets ed on Dec. 10, 2010. The entirety of the above-mentioned patent application is hereby incorporated by reference herein and made a part of this specification.

CONDUCTIVE PAD STRUCTURE, CHIP PACKAGE STRUCTURE AND DEVICE SUBSTRATE

CROSS-REFERENCE TO RELATED APPLICATION

This application claims the priority benefit of Taiwan application serial no. 99224056, filed on Dec. 10, 2010. The entirety of the above-mentioned patent application is hereby incorporated by reference herein and made a part of this specification.

BACKGROUND OF THE INVENTION

1. Field of Invention

The invention relates to a conductive pad structure. More particularly, the invention relates to a conductive pad structure having a non-closed pattern.

2. Description of Related Art

With rapid advancement in the liquid crystal display (LCD) technology, the up-to-date LCDs have been developing toward high brightness, wide viewing angle, fast responding speed, high resolution, and full-color display.

In general, a plurality of conductive pads are configured in a peripheral circuit area of the LCD panel, and a driving chip is adhered to the conductive pads by an anisotropic conductive film (ACF). Thereby, a bump of the driving chip and the conductive pads of the LCD panel can be conducted by conductive particles in the ACF.

FIG. 1A is a schematic cross-sectional view illustrating a conventional conductive pad structure. FIG. 1B is a schematic top view illustrating the conductive pad structure depicted in FIG. 1A. With reference to FIG. 1A and FIG. 1B, the conventional conductive pad structure 100 includes a conductive pad 102 and a plurality of closed, ring-shaped protruding ribs 104 which are configured on the conductive pad 102. An ACF P is configured between the conductive pad structure 100 and a bump 108 of a driving chip 106. The ACF P includes conductive particles 110 and an adhesive 112.

When the bump 108 of the driving chip 106 is adhered to the conductive pad structure 100, the closed, ring-shaped protruding ribs 104 can capture the conductive particles 110, such that the amount of the conductive particles 110 can be increased.

However, as indicated in FIG. 1A, when the bump 108 of the driving chip 106 is adhered to the conductive pad structure 100, and the amount of the ACF P is excessive, the excessive and unnecessary ACF P cannot be removed because of the closed, ring-shaped protruding ribs 104. Thereby, the bump 108 of the driving chip 106 and the conductive pad structure 100 cannot be closely adhered to each other, which deteriorates the transmission of electric signals between the bump 108 and the conductive pad structure 100.

SUMMARY OF THE INVENTION

In view of the above, the invention is directed to a non-closed conductive pad structure which can resolve an issue of unfavorable adhesion between a bump of a driving chip and the conductive pad structure.

The invention is further directed to a chip package structure and a device substrate that both have the conductive pad structure, and the electrical connection between the bump of the driving chip and the conductive pad structure is favorable.

In an embodiment of the invention, a conductive pad structure is configured in a peripheral circuit area of a device substrate. The conductive pad structure includes a conductive pad and a plurality of conductive spacers. The conductive spacers are configured on the conductive pad and arranged as a non-closed pattern on the conductive pad.

In an embodiment of the invention, a device substrate has a device area and a peripheral circuit area that surrounds the device area. The device substrate includes a chip, a conductive pad structure, and an ACF. The chip is configured in the peripheral circuit area and has at least one conductive bump. The conductive pad structure is configured in the peripheral circuit area and includes a conductive pad and a plurality of conductive spacers. The conductive spacers are configured on the conductive pad and arranged as a non-closed pattern on the conductive pad. The ACF is located between the conductive bump and the conductive pad structure.

In an embodiment of the invention, a chip package structure is configured in a peripheral circuit area of a device substrate. The chip package structure includes a chip and a conductive pad structure. The chip has at least one conductive bump. The conductive pad structure includes a conductive pad and a plurality of conductive spacers. The conductive spacers are configured on the conductive pad and arranged as a non-closed pattern on the conductive pad. The ACF is located between the conductive bump and the conductive pad structure.

According to an embodiment of the invention, the non-closed pattern at least includes a first non-closed pattern and a second non-closed pattern. The first non-closed pattern has a plurality of first openings. The second non-closed pattern has a plurality of second openings, and the second non-closed pattern surrounds the first non-closed pattern.

According to an embodiment of the invention, a width of the first openings and a width of the second openings range from about 1 micrometer to about 5 micrometers.

According to an embodiment of the invention, a shape of the non-closed pattern comprises a rectangular shape, a circular shape, a triangular shape, or an elliptical shape.

According to an embodiment of the invention, the conductive spacers comprise a plurality of protruding ribs or a plurality of dot-shaped protrusions.

According to an embodiment of the invention, a thickness of the conductive pad ranges from about 0.1 micrometer to about 2 micrometers.

According to an embodiment of the invention, the conductive pad and the conductive spacers are integrally formed.

According to an embodiment of the invention, the ACF includes an adhesive and a plurality of conductive particles. The conductive particles are distributed in the adhesive, and the chip is electrically connected to the conductive pad structure through the conductive particles.

Based on the above, the conductive spacers arranged as a non-closed pattern are configured on the conductive pad as described in the embodiments of the invention. When the chip and the conductive pad are adhered by the ACF, the excessive, unnecessary ACF can be removed from openings between the conductive spacers. As a result, the conductive bump of the driving chip and the conductive pad structure can be adhered to a better extent, and favorable transmission of electrical signals between the conductive bump of the driving chip and the conductive pad structure can be guaranteed.

In order to make the aforementioned and other features and advantages of the invention more comprehensible, several embodiments accompanied with figures are described in detail below.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

In the invention, a conductive pad structure is provided. When a bump of a driving chip and the conductive pad structure are adhered by an ACF, the issue of unfavorable adhesion between the bump and the conductive pad structure can be resolved. The conductive pad structure can be applied to various chip package structures and related electronic devices, i.e, various device substrates. More specifically, the conductive pad structure can be configured in a peripheral circuit area of a device substrate which has a device area and a peripheral circuit area surrounding the device area. In the following embodiments of the invention, the conductive pad structure is exemplarily applied to an active device array substrate of an LCD, but not limit to thereof. Note that, "the active device array substrate" is an example of "the device substrate", and "the display area" is corresponding to "the device area".

Figure 1A:
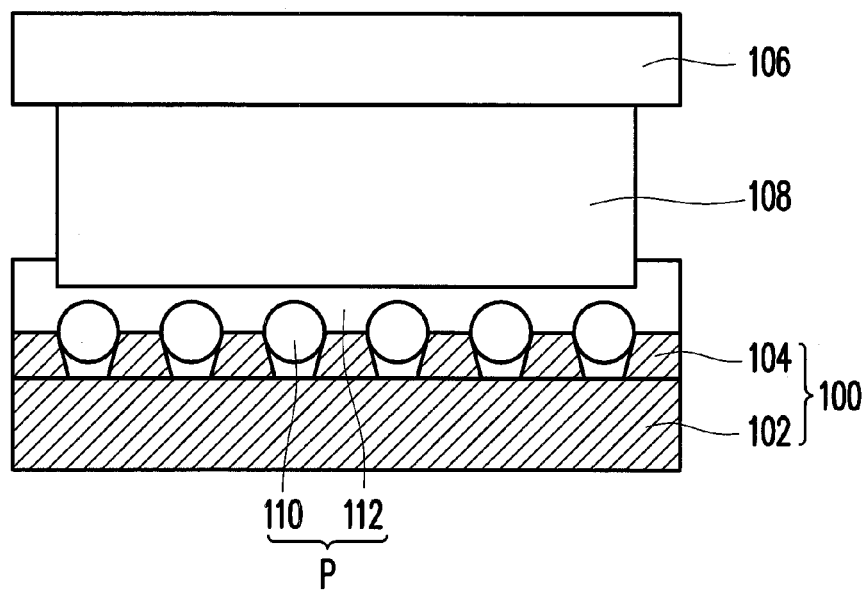
FIG. 1A is a schematic cross-sectional view illustrating a conventional conductive pad structure.
Figure 1B:
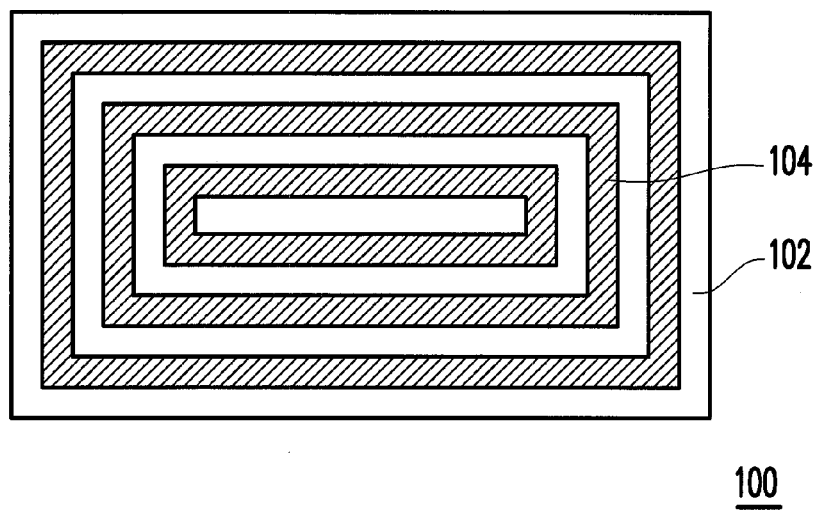
FIG. 1B is a schematic top view illustrating the conductive pad structure depicted in FIG. 1A.
Figure 2:
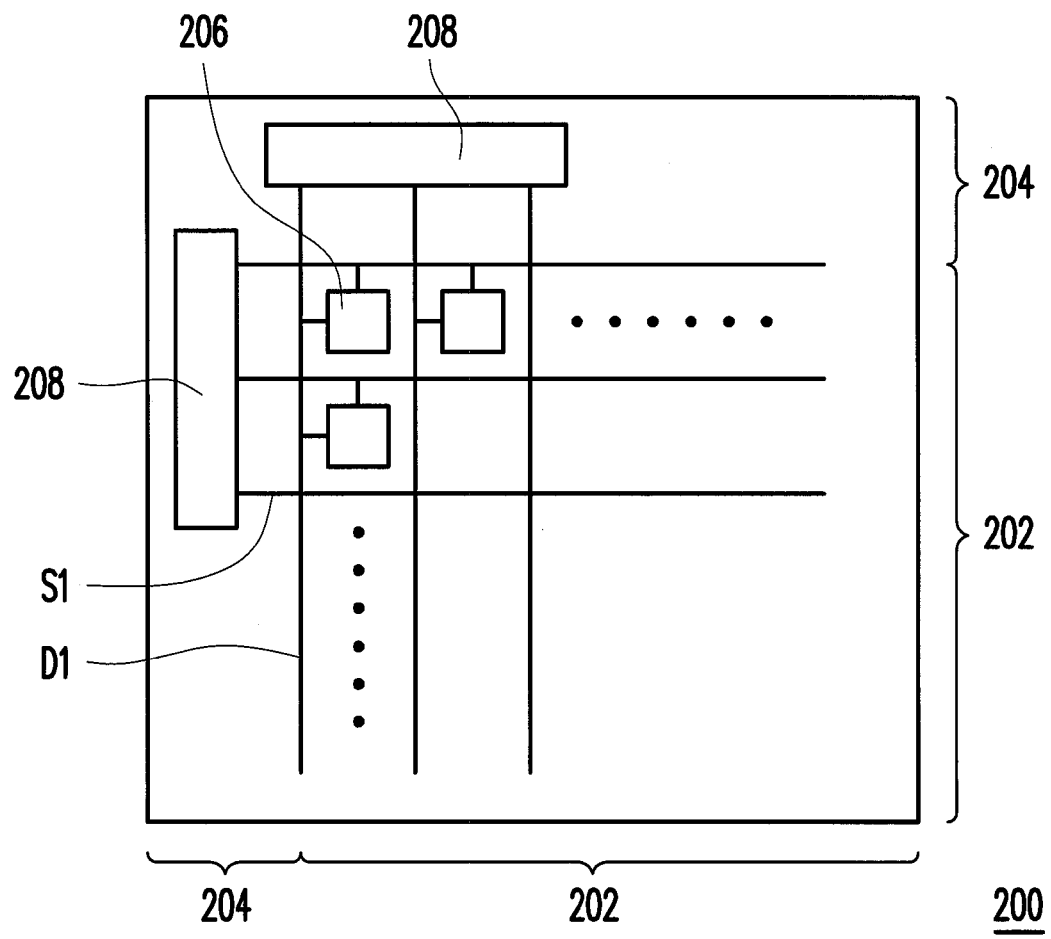
FIG. 2 is a schematic top view illustrating an active device array substrate according to an embodiment of the invention.

FIG. 2 is a schematic top view illustrating an active device array substrate according to an embodiment of the invention. With reference to FIG. 2, the active device array substrate 200 includes a display area 202 and a peripheral circuit area 204 that surrounds the display area 202. The type of the active device array substrate 200 is not limited in the invention. For instance, the active device array substrate 200 can be a well-known thin film transistor (TFT) array substrate, and the TFT is an amorphous silicon TFT or a polysilicon TFT, for instance. In addition, the active device array substrate 200 can also be a color filter on array (COA) substrate.

With reference to FIG. 2, a plurality of scan lines S1, a plurality of data lines D1, and a plurality of pixel units 206 are configured on the display area 202 of the active device array substrate 200. Here, the pixel units 206 are arranged in arrays. The scan lines Si and the data lines D1 are perpendicular, and each of the pixel units 206 is electrically connected to one of the scan lines S1 and one of the data lines D1. A plurality of chip package structures 208 can be configured on the peripheral circuit area 204. The individual chip package structure 208 is shown in FIG. 3.

Figure 3:
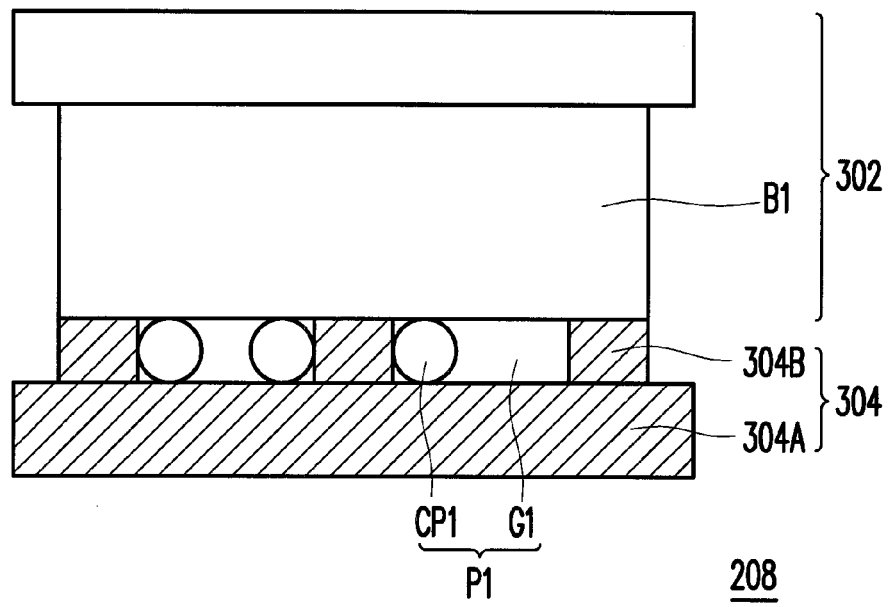
FIG. 3 is a schematic cross-sectional view illustrating the chip package structure 208 depicted in FIG. 2.

FIG. 3 is a schematic cross-sectional view illustrating the chip package structure 208 depicted in FIG. 2. With reference to FIG. 2 and FIG. 3, the chip package structure 208 includes a chip 302, a conductive pad structure 304, and an ACF P1. The chip 302 has at least one conductive bump B1, and the chip 302 provides driving signals to the scan lines S1 and the data lines D1, such that the pixel units 206 can display images. The conductive bump B1 is often made of conductive metal, e.g., aurum (Au) with great conductivity.

The conductive pad structure 304 includes a conductive pad 304A and conductive spacers 304B. The conductive spacers 304B are arranged as a non-closed pattern, which will be described later with reference to FIG. 4. The ACF P1 is located between the conductive bump B1 and the conductive pad structure 304. The ACF P1 can include an adhesive G1 and a plurality of conductive particles CP1. The adhesive G1 is resin, for instance. The conductive bump B1 of the chip 302 and the conductive pad structure 304 can be electrically connected by conductive particles CP1 of the ACF P1. Preferably, the thickness of the conductive pad 304A ranges from about 0.1 micrometer to about 2 micrometers, the diameter of the conductive particles CP1 ranges from about 1 micrometer to about 5 micrometers, and the thickness of the conductive spacers 304B ranges from about 0.5 micrometer to about 2 micrometers.

Figure 4:
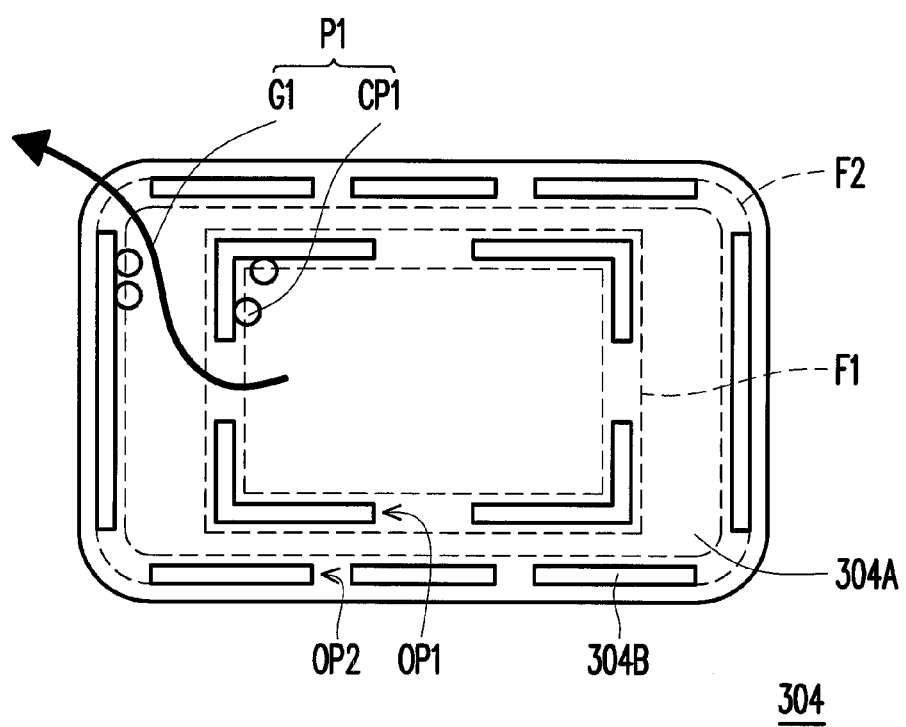
FIG. 4 is a schematic top view illustrating the conductive pad structure depicted in FIG. 3.

FIG. 4 is a schematic top view illustrating the conductive pad structure depicted in FIG. 3. With reference to FIG. 4, the conductive pad structure 304 can include a conductive pad 304A and a plurality of conductive spacers 304B configured on the conductive pad 304A. The conductive spacers 304B are arranged as a non-closed pattern on the conductive pad 304A.

For instance, as shown in FIG. 4, the conductive spacers 304B on the conductive pad 304A can be a plurality of L-shaped or bar-shaped protruding ribs. A rectangular first non-closed pattern F1 can be surrounded by the L-shaped conductive spacers 304B, and the rectangular second non-closed pattern F2 can be surrounded by the bar-shaped conductive spacers 304B. The second non-closed pattern F2 surrounds the first non-closed pattern F1.

Note that the first non-closed pattern F1 and the second non-closed pattern F2 respectively have a plurality of first openings OP1 and a plurality of second openings OP2. The first openings OP1 of the first non-closed pattern F1 correspond to non-openings (where no opening is formed) of the second non-closed pattern F2. The width of the first openings OP1 and the width of the second openings OP2 can be slightly smaller than or equal to the diameter of the conductive particles CP1, e.g., from about 1 micrometer to about 5 micrometers.

The excessive and unnecessary adhesive G1 can be removed from the first and second openings OP1 and OP2, and thereby the adhesion between the conductive bump B1 of the chip 302 and the conductive pad structure 304 can be increased. Besides, the conductive particles CP1 can be captured by the non-closed patterns F1 and F2. As such, when the excessive and unnecessary adhesive G1 is removed from the conductive pad structure 304, the excessive conductive particles CP1 are not simultaneously removed from the conductive pad structure 304.

With reference to FIG. 3 and FIG. 4, the conductive pad 304A and the conductive spacers 304B are integrally formed by defining where the conductive spacers 304B are located on the conductive pad 304A through performing a photolithography process and by forming the conductive spacers 304B on the conductive pad 304A through performing a wet etching process or a dry etching process, for instance. However, the conductive pad 304A can be formed at first, and a deposition process can then be performed with use of a mask to deposit the conductive spacers 304B on the conductive pad 304A.

The conductive spacers 304B that are arranged as the non-closed pattern on the conductive pad 304A are not limited to those described in the embodiment shown in FIG. 4. Other ways to arrange the conductive spacers 304B as a non-closed pattern on the conductive pad 304A are described in the following embodiments.

Figure 5:
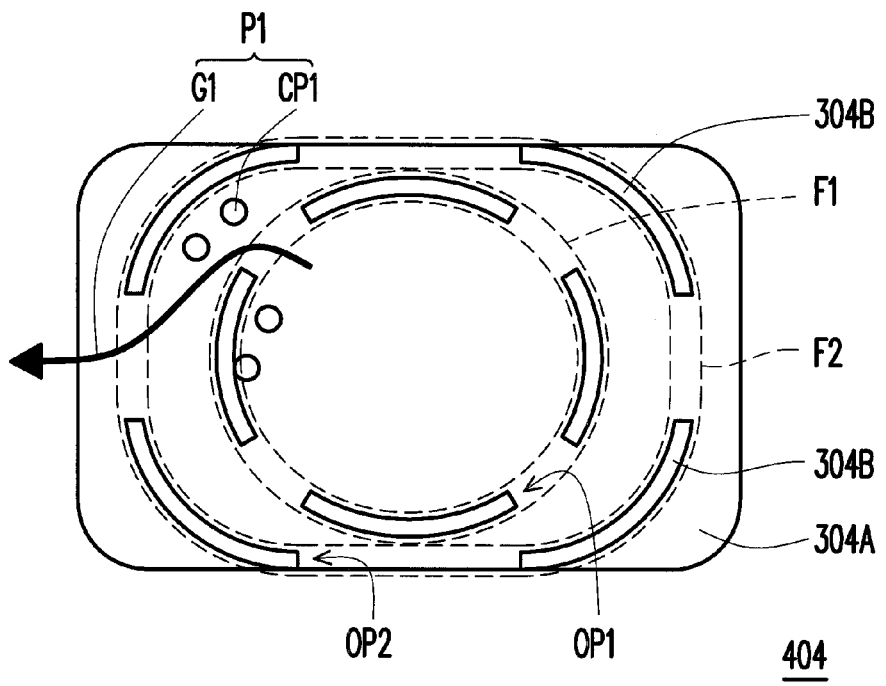
FIG. 5 is a schematic top view illustrating a conductive pad structure according to another embodiment of the invention.

FIG. 5 is a schematic top view illustrating a conductive pad structure according to another embodiment of the invention. With reference to FIG. 5, the conductive pad structure 404 is similar to the conductive pad structure 304 depicted in FIG. 4, and the same elements in FIG. 5 and FIG. 4 are marked by the same reference numbers. The difference therebetween lies in that the conductive spacers 304B of this embodiment are arc-shaped protruding ribs. The elliptical first non-closed pattern F1 is surrounded by some of the conductive spacers 304B, and the elliptical second non-closed pattern F2 are surrounded by the other conductive spacers 304B.

Similarly, in this embodiment, the second non-closed pattern F2 surrounds the first non-closed pattern F1, and the openings OP1 of the first non-closed pattern F1 correspond to the non-openings (where no opening is formed) of the second non-closed pattern F2. The width of the first openings OP1 and the width of the second openings OP2 can be less than or equal to the diameter of the conductive particles CP1 (e.g., from about 1 micrometer to about 5 micrometers), such that the conductive particles CP1 are not removed from the conductive pad structure 404 when the excessive and unnecessary adhesive G1 is removed from the conductive pad structure 404.

Note that the non-closed pattern formed by arranging the conductive spacers 304B on the conductive pad 304A is not limited to the inner first non-closed pattern F1 and the outer second non-closed pattern F2. In other embodiments of the invention, more non-closed patterns arranged in different layers can be formed on the conductive pad 304A, so as to better capture the conductive particles CP1.

Besides, the non-closed pattern is not limited to be in the rectangular shape or in the elliptical shape described above and can be in other geometric shapes (e.g., in a circular shape or a triangular shape) or in an irregular shape. As long as the arranged pattern is a non-closed pattern and can prevent the conductive particles CP1 from being removed from the conductive pad structure 304 and 404 when the adhesive G1 is removed from the conductive pad structure 304 and 404, the pattern does not go beyond the scope of the invention.

Figure 6:
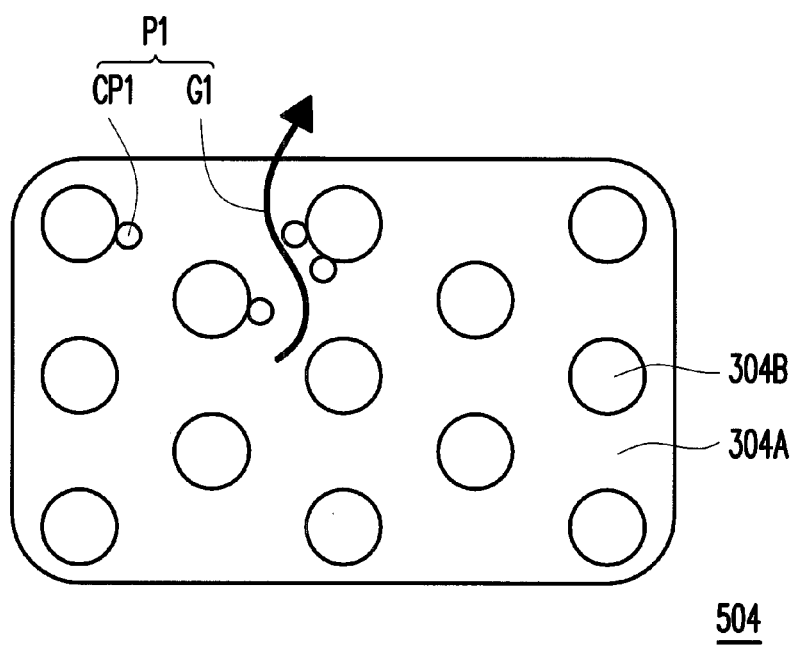
FIG. 6 is a schematic top view illustrating a conductive pad structure according to yet another embodiment of the invention.

FIG. 6 is a schematic top view illustrating a conductive pad structure according to yet another embodiment of the invention. With reference to FIG. 6, the conductive pad structure 504 is similar to the conductive pads 304 and 404 described above, and the difference therebetween lies in that the conductive spacers 304B of this embodiment are dot-shaped protrusions. The surface roughness of the conductive pad 304A can be increased by distributing a plurality of the dot-shaped protrusions onto the conductive pad 304A. When the conductive bump B1 is adhered to the conductive pad structure 504 depicted in FIG. 6, the excessive and unnecessary adhesive G1 can still be removed from the conductive pad structure 504 through the space between the conductive spacers 304B (i.e., the dot-shaped protrusions). Since the conductive spacers 304B (i.e., the dot-shaped protrusions) can block the conductive particles CP1, the number of the conductive particles CP1 which are captured and kept on the conductive pad 304A can be increased.

Note that the dot-shaped protrusions described in the embodiment shown in FIG. 6 can be applied to another conductive pad structure that has the pattern arranged in a different manner according to other embodiments of the invention. Namely, the conductive pad spacers 304B depicted in FIG. 4 and FIG. 5 can be replaced by the dot-shaped protrusions, and the dot-shaped protrusions are arranged as a non-closed pattern in a rectangular shape or an elliptical shape.

In light of the foregoing, the conductive pad structure, the chip package structure, and the device substrate described in the embodiments of the invention have at least the following advantages.

The conductive spacers arranged as the non-closed pattern are configured on the conductive pad. When the chip is adhered to the conductive pad structure, the excessive and unnecessary ACF can be removed from the openings between the conductive spacers, so as to enhance the adhesion between the conductive bump and the conductive pad structure. Moreover, the conductive spacers can capture the conductive particles. As such, the number of the conductive particles left on the conductive pad can be increased because of the conductive spacers. The conductive pad structure can be applied to various chip package structures and related electronic devices.

Although the invention has been described with reference to the embodiments thereof, it will be apparent to one of the ordinary skills in the art that modifications to the described embodiments may be made without departing from the spirit of the invention. Accordingly, the scope of the invention will be defined by the attached claims not by the above detailed description.

What is claimed is:

1. A conductive pad structure, configured in a peripheral circuit area of a device substrate, wherein the peripheral circuit area comprises a chip, the conductive pad structure comprising:
   a conductive pad, directly and electrically connected to the chip through an anisotropic conductive film (ACF); and
   a plurality of conductive spacers, configured on the conductive pad and arranged as a non-closed pattern on the conductive pad.

2. The conductive pad structure as claimed in claim 1, wherein the non-closed pattern at least comprises:
   a first non-closed pattern, having a plurality of first openings; and
   a second non-closed pattern, having a plurality of second openings,
   the second non-closed pattern surrounding the first non-closed pattern.

3. The conductive pad structure as claimed in claim 2, wherein a width of the first openings and a width of the second openings range from about 1 micrometer to about 5 micrometers.

4. The conductive pad structure as claimed in claim 1, wherein a shape of the non-closed pattern comprises a rectangular shape, a circular shape, a triangular shape, or an elliptical shape.

5. The conductive pad structure as claimed in claim 1, wherein the conductive spacers comprise a plurality of protruding ribs or a plurality of dot-shaped protrusions.

6. The conductive pad structure as claimed in claim 1, wherein a thickness of the conductive pad ranges from about 0.1 micrometer to about 2 micrometers.

7. The conductive pad structure as claimed in claim 1, wherein the conductive pad and the conductive spacers are integrally formed.

8. A device substrate, having a device area and a peripheral circuit area surrounding the device area, the device substrate comprising:
   a chip, configured in the peripheral circuit area and having at least one conductive bump;
   a conductive pad structure, configured in the peripheral circuit area and comprising:
      a conductive pad; and a plurality of conductive spacers, configured on the conductive pad and
arranged as a non-closed pattern on the conductive pad; and
an anisotropic conductive film, located between the at least one conductive bump and the conductive pad structure, wherein the conductive pad is directly and electrically connected to the at least one conductive bump through the anisotropic conductive film (ACF).

9. The device substrate as claimed in claim 8, wherein the non-closed pattern at least comprises:
a first non-closed pattern, having a plurality of first openings; and
a second non-closed pattern, having a plurality of second openings,
the second non-closed pattern surrounding the first non-closed pattern.

10. The active device array substrate as claimed in claim 9, wherein a width of the first openings and a width of the second openings range from about 1 micrometer to about 5 micrometers.

11. The device substrate as claimed in claim 8, wherein a shape of the non-closed pattern comprises a rectangular shape, a circular shape, a triangular shape, or an elliptical shape.

12. The device substrate as claimed in claim 8, wherein the conductive spacers comprise a plurality of protruding ribs or a plurality of dot-shaped protrusions.

13. The device substrate as claimed in claim 8, wherein a thickness of the conductive pad ranges from about 0.1 micrometer to about 2 micrometers.

14. The device substrate as claimed in claim 8, wherein the conductive pad and the conductive spacers are integrally formed.

15. The device substrate as claimed in claim 8, wherein the anisotropic conductive film comprises:
an adhesive; and
a plurality of conductive particles, distributed in the adhesive,
the chip being electrically connected to the conductive pad structure through the conductive particles.

16. A chip package structure, configured in a peripheral circuit area of a device substrate, the chip package structure comprising:
a chip, having at least one conductive bump;
a conductive pad structure comprising:
a conductive pad; and
a plurality of conductive spacers, configured on the conductive pad and arranged as a non-closed pattern on the conductive pad; and
an anisotropic conductive film, located between the at least one conductive bump and the conductive pad structure, wherein the conductive pad is directly and electrically connected to the at least one conductive bump through the anisotropic conductive film (ACF).

* * * * *